(12) United States Patent
Rokhsaz

(10) Patent No.: US 7,586,385 B2
(45) Date of Patent: Sep. 8, 2009

(54) METHOD AND APPARATUS FOR VARYING AN IMPEDANCE

(75) Inventor: Shahriar Rokhsaz, Austin, TX (US)

(73) Assignee: RFMicron, Inc., Austin, TX (US)

( * ) Notice: Subject to any disclaimer, the term of this patent is extended or adjusted under 35 U.S.C. 154(b) by 249 days.

(21) Appl. No.: 11/601,085

(22) Filed: Nov. 18, 2006

(65) Prior Publication Data

US 2008/0116990 A1   May 22, 2008

(51) Int. Cl.
*H03H 7/40* (2006.01)

(52) U.S. Cl. ............... 333/17.3; 333/175; 333/174

(58) Field of Classification Search ........... 333/17.1, 333/173, 174, 175, 176

See application file for complete search history.

(56) References Cited

U.S. PATENT DOCUMENTS

| | | | | |
|---|---|---|---|---|
| 5,541,558 | A | * | 7/1996 | Weber et al. ........... 333/174 |
| 5,589,844 | A | * | 12/1996 | Belcher et al. .......... 343/860 |
| 7,055,754 | B2 | | 5/2005 | Forster |
| 2005/0184922 | A1 | * | 8/2005 | Ida et al. ............. 343/861 |

OTHER PUBLICATIONS

Fernald, Cook, Miller & Paulos; A Microprocessor-Based Implantable Telemetry System; Computer, pp. 23-30, Mar 1991.

Fernald, Paulos, Stackhouse & Heaton; A Self-Tuning Digital Telemetry IC for Use in a Microprocessor-Based Implantable Instrument; J. Solid-State Cir., v.27, pp. 1826-1832, Dec. 1992.

Fernald, Paulos, Stackhouse & Heaton; An Implantable Digital Telemetry IC Using an Automatic Resonant -Frequency Search Technique; ISSCC 92, WP 44, 1992.

Fernald, Stackhouse, Paulos & Miller; A System Architecture for Intelligent Implantable Biotelemetry Instruments; Proc. IEEE Eng in Medicine Conf, pp. 1411-1412, Nov. 1989.

Paulos, Fernald & Poulton; Custom ICs for Biomedical Applications; Proc. 1st Symp. Comm., Signal Proc, Expert Sys & ASIC VLSI Design, pp. 45-48, Mar. 1990; w/slides.

Paulos & Miller; Analog Circuits NSF/ERC Core A.2; Proc. IEEE Eng in Medicine Conf., pp. 677-678, Nov. 1990; w/slides.

Stackhouse; A Transmitter Circuit Design for an Implantable Biomedical Chip Set; Masters Thesis, NC State Univ, E&CE Dept., 1989.

Fernald; A Microprocessor-Based System for the Fast Prototyping of Implantable Instruments for Biomedical Research Application; PhD Thesis, NC State Univ, E&CE Dept., 1992.

T. A. Scharfeld, "An Analysis of the Fundamental Constraints on Low Cost Passive Radio-Frequency Identification System Design", MIT (Aug. 2001).

Zhongkai Zhong, "An Analog Cell Library Useful for Artificial Neural Networks", IEEE Proceedings—1990 Southeastcon.

* cited by examiner

*Primary Examiner*—Benny Lee
*Assistant Examiner*—Gerald Stevens
(74) *Attorney, Agent, or Firm*—Jeffrey Van Myers

(57) ABSTRACT

A method and apparatus for dynamically varying the impedance of a tank circuit whereby, over time, the response of the circuit to a received signal is maximized.

31 Claims, 2 Drawing Sheets

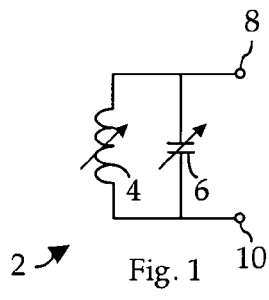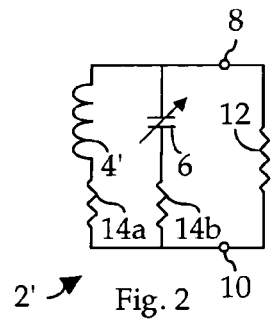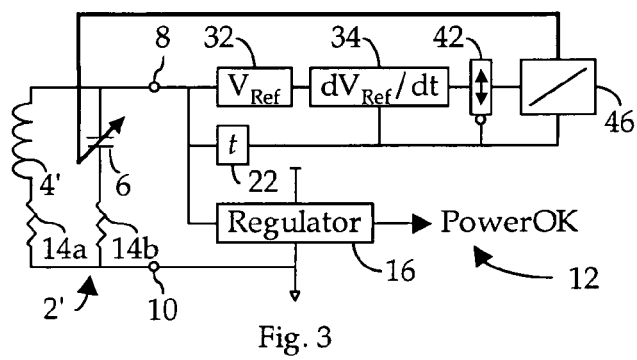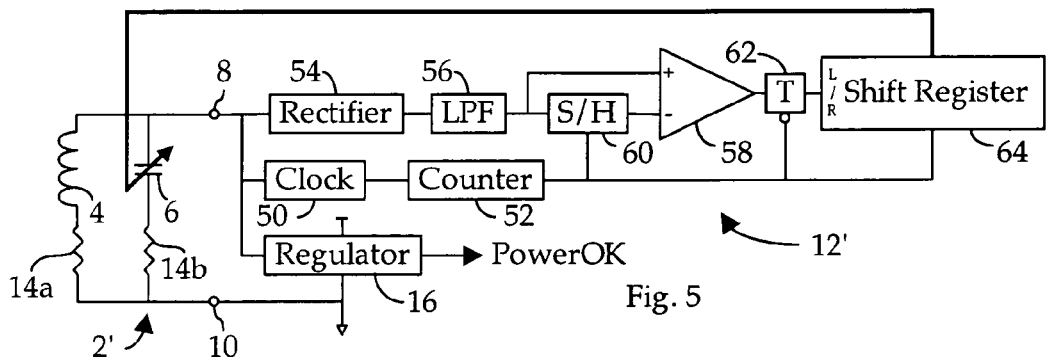

METHOD AND APPARATUS FOR VARYING AN IMPEDANCE

BACKGROUND OF THE INVENTION

1. Field of the Invention

The present invention relates generally to variable impedances, and, in particular, to a variable impedance for use in a tank circuit.

2. Description of the Related Art

In general, in the descriptions that follow, I will italicize the first occurrence of each special term of art which should be familiar to those skilled in the art of radio frequency ("RF") communication systems. In addition, when I first introduce a term that I believe to be new or that I will use in a context that I believe to be new, I will bold the term and provide the definition that I intend to apply to that term. In addition, throughout this description, I will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, I may refer to the mutually exclusive boolean states as logic_0 and logic_1. Of course, as is well know, consistent system operation can be obtained by reversing the logic sense of all such signals, such that signals described herein as logically true become logically false and vice versa. Furthermore, it is of no relevance in such systems which specific voltage levels are selected to represent each of the logic states.

In general, in an RF communication system, an antenna structure is used to receive signals, the carrier frequencies ("$f_C$") of which may vary significantly from the natural resonant frequency ("$f_R$") of the antenna. It is well known that mismatch between $f_C$ and $f_R$ results in loss of transmitted power. In some applications, this may not be of particular concern, but, in others, such as in RF identification ("RFID") applications, such losses are of critical concern. For example, in a passive RFID tag, a significant portion of received power is used to develop all of the operating power required by the tag's electrical circuits. In such an application, it is known to employ a variable impedance circuit to shift the $f_R$ of the tag's receiver so as to better match the $f_C$ of the transmitter of the system's RFID reader.

Although it would be highly desirable to have a single design that is useful in all systems, one very significant issue in this regard is the lack of international standards as to appropriate RFID system frequencies, and, to the extent there is any de facto standardization, the available frequency spectrum is quite broad: Low-Frequency ("LF"), including 125-134.2 kHz and 140-148.f kHz; High-Frequency ("HF") at 13.56 MHz; and Ultra-High-Frequency ("UHF") at 868-928 MHz. Compounding this problem is the fact that system manufacturers cannot agree on which specific $f_C$ is the best for specific uses, and, indeed, to prevent cross-talk, it is desirable to allow each system to distinguish itself from nearby systems by selecting different $f_C$ within a defined range.

As explained in, for example, U.S. Pat. No. 7,055,754 (incorporated herein by reference), attempts have been made to improve the ability of the tag's antenna to compensate for system variables, such as the materials used to manufacture the tag. However, such structural improvements, while valuable, do not solve the basic need for a variable impedance circuit having a relatively broad tuning range.

Shown in FIG. 1 is an ideal variable impedance circuit 2 comprised of a variable inductor 4 and a variable capacitor 6 coupled in parallel with respect to nodes 8 and 10. In such a system, the undamped resonance or resonant frequency of circuit 2 is:

$$\omega_R = \frac{1}{\sqrt{LC}} \quad [\text{Eq. 1}]$$

where: $\omega_R$=the resonant frequency in radians per second;
L=the inductance of inductor 2, measured in henries; and
C=the capacitance of capacitor 6, measured in farads.
On, in the alternative form:

$$f_R = \frac{\omega_R}{2\pi} = \frac{1}{2\pi\sqrt{LC}} \quad [\text{Eq. 2}]$$

where: $f_R$=the resonant frequency in hertz.
As is well known, the total impedance of circuit 2 is:

$$Z = \frac{RLS}{RLCS^2 + LS + R} \quad [\text{Eq. 3}]$$

where: Z=the total impedance of circuit 2, measured in ohms;
R=the total resistance of circuit 2, including any parasitic resistance(s), measured in ohms;
L=the inductance of inductor 2, measured in henries; and
S=j$\omega$;
where: j=the imaginary unit $\sqrt{-1}$; and
$\omega$ is the resonant frequency in radians-per-second.
As is known, for each of the elements of circuit 2, the relationship between impedance, resistance and reactance is:

$$Z_e = R_e + jX_e \quad [\text{Eq. 4}]$$

where: $Z_e$=impedance of the element, measured in ohms;
$R_e$=resistance of the element, measured in ohms;
j=the imaginary unit $\sqrt{-1}$; and
$X_e$=reactance of the element, measured in ohms.
Although in some situations phase shift may be relevant, in general, it is sufficient to consider just the magnitude of the impedance:

$$|Z| = \sqrt{R^2 + X^2} \quad [\text{Eq. 5}]$$

For a purely inductive or capacitive element, the magnitude of the impedance simplifies to just the respective reactances. Thus, for inductor 4, the magnitude of the reactance can be expressed as:

$$X_L = |j2\pi fL| = j2\pi fL \quad [\text{Eq. 6}]$$

Similarly, for capacitor 6, the magnitude of the reactance can be expressed as:

$$X_C = \left|\frac{1}{j2\pi fC}\right| = \frac{1}{2\pi fC} \quad [\text{Eq. 7}]$$

Because the reactance of inductor 4 is in phase while the reactance of capacitor 6 is in quadrature, the reactance of inductor 4 is positive while the reactance of capacitor 6 is negative. Resonance occurs when the absolute values of the reactances of inductor 4 and capacitor 6 are equal, at which point the reactive impedance of circuit 2 becomes zero, leaving only a resistive load.

As is known, the response of circuit 2 to a received signal can be expressed as a transfer function of the form:

$$H(j\omega) = \frac{\frac{1}{R} + j\left(-C\omega + \frac{1}{L\omega}\right)}{\frac{1}{R^2} + \left(-C\omega + \frac{1}{L\omega}\right)^2} \quad [\text{Eq. 8}]$$

Within known limits, changes can be made in the relative values of inductor 4 and capacitor 6 to converge the resonant frequency, $f_R$, of circuit 2 to the carrier frequency, $f_C$, of a received signal. As a result of each such change, the response of circuit 2 will get stronger. In contrast, each change that results in divergence will weaken the response of circuit 2.

A discussion of these and related issues can be found in the Masters Thesis of T. A. Scharfeld, entitled "An Analysis of the Fundamental Constraints on Low Cost Passive Radio-Frequency Identification System Design", Massachusetts Institute of Technology (August 2001), a copy of which is submitted herewith and incorporated herein in its entirety by reference.

I submit that what is needed is an efficient method and apparatus for dynamically varying the impedance of a tank circuit, and, in particular, wherein the impedance of the circuit can be efficiently varied so as to dynamically shift the $f_R$ of the circuit to better match the $f_C$ of a received signal and thereby improve the response of the circuit.

BRIEF SUMMARY OF THE INVENTION

In accordance with a preferred embodiment of my invention, I provide a method for dynamically varying the impedance of a tank circuit comprising an inductor and a capacitor, the capacitance of which can be selectively varied. According to my method, I first select which direction I will initially vary the capacitance, that is, either up or down. I then capture the current response of the circuit to a received signal. Next, I vary the capacitor in the direction I just selected. Then, I compare the captured response to the current response, and, if the comparison indicates that the current response is weaker than the captured response, I change my selection for which direction that I will next vary the capacitance, and repeat the capture, vary and compare steps. Although my method is inherently recursive in nature, it will be appreciated that the initially selected rate of recursion can be increased, decreased or even stopped under appropriate conditions.

In accordance with another preferred embodiment of my invention, I provide a tuning circuit for dynamically varying the impedance of a tank circuit comprising an inductor and a capacitor, the capacitance of which can be selectively varied. In my preferred tuning circuit, a reference voltage generator, coupled to the tank circuit, produces a reference voltage proportional to the response of the tank circuit to a received signal. A differentiator, coupled to the generator, then determines the polarity of the change in the reference voltage between a first point in time and a second point in time. Next, a direction selector, coupled to the differentiator and adapted to respond to the determined polarity, selects one of two different directions in which the capacitance of the capacitor can be varied. Finally, a ramp generator, coupled to the selector and to the capacitor, selectively varies the capacitance of the capacitor in the currently-selected direction. As with my preferred method, my preferred tuning circuit is inherently recursive in operation, and the initially selected rate of recursion can be easily increased, decreased or even stopped under appropriate conditions.

I submit that each of these embodiments of my invention more efficiently dynamically vary the impedance of a tank circuit so as to dynamically shift the $f_R$ of the circuit to better match the $f_C$ of a received signal and thereby improve the response of the circuit.

BRIEF DESCRIPTION OF THE SEVERAL VIEWS OF THE DRAWINGS

My invention may be more fully understood by a description of certain preferred embodiments in conjunction with the attached drawings in which:

FIG. 1 is an ideal variable impedance tank circuit;

FIG. 2 is a practical embodiment of the tank circuit shown in FIG. 1;

FIG. 3 illustrates in block schematic form, a receiver circuit constructed in accordance with a preferred embodiment of my invention;

FIG. 5 illustrates in block schematic form, a receiver circuit constructed in accordance with another preferred embodiment of my invention;

Figure 4:
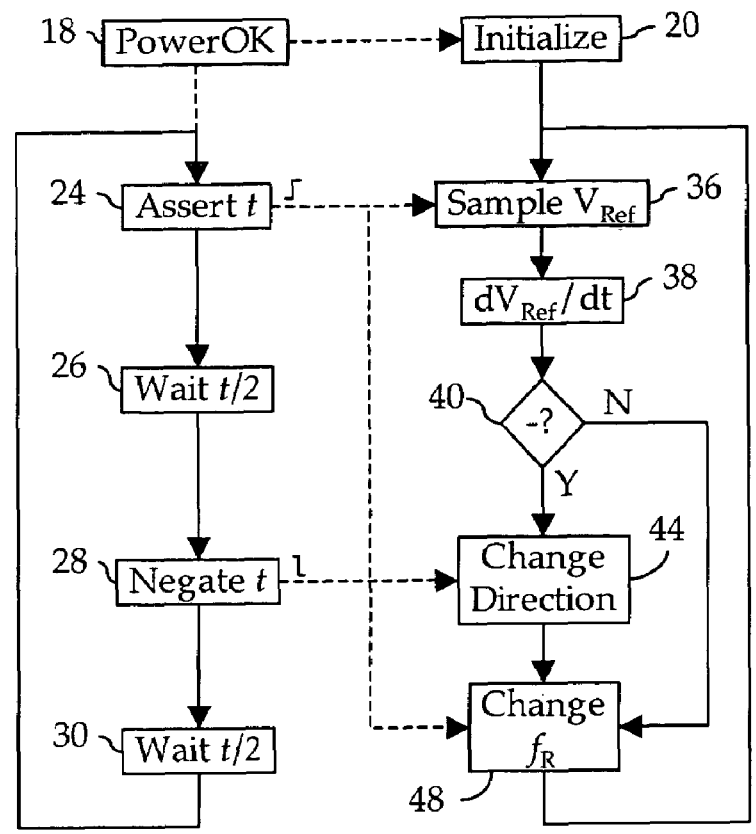
FIG. 4 illustrates in flow diagram form the sequencing of operations in the receiver circuit shown in FIG. 3.

In the drawings, similar elements will be similarly numbered whenever possible. However, this practice is simply for convenience of reference and to avoid unnecessary proliferation of numbers, and is not intended to imply or suggest that my invention requires identity in either function or structure in the several embodiments.

DETAILED DESCRIPTION OF THE INVENTION

As shown in the variable tank circuit 2' in FIG. 2, in many applications, such as RFID tags, it may be economically desirable to substitute for variable inductor 4 a fixed inductor 4'. In addition, one must take into consideration the inherent input resistance, $R_1$, of the load circuit 12, as well as the parasitic resistances 14a of inductor 4' and 14b of capacitor 6.

In accordance with the preferred embodiment of my invention as shown in FIG. 3, the amplitude modulated ("AM") signal broadcast by the reader in an RFID system will be magnetically coupled to a conventional coil antenna comprising inductor 4', and a portion of the induced current is extracted via nodes 8 and 10 by a regulator 16 to produce operating power for all other circuits. Once sufficient stable power is available, regulator 16 will produce a PowerOK signal to initiate system operation (see, 18 and 20 in FIG. 4). If desired, a variable resistor (not shown) can be provided in parallel with inductor 4', generally between nodes 8 and 10, and regulator 16 can be constructed so as to automatically vary this resistance to control the gain of the tank circuit 2'.

In response to the PowerOK signal, a timer 22 will periodically generate a timing pulse t (see, generally, 24, 26, 28, and 30 in FIG. 4). Preferably, the frequency of t pulses is a selected sub-multiple of the received signal, and the duty cycle is on the order of fifty percent (50%). However, as will be explained below, other duty cycles may be appropriate depending on the specific circuit elements selected to implement my invention.

In response to the PowerOK signal, a reference voltage generator 32 will continuously produce a reference voltage signal $V_{Ref}$ proportional to the voltage induced by the received signal between nodes 8 and 10. In response to the assertion of each t pulse, a differentiator 34, will save the then-current value of the $V_{Ref}$ signal (see, 36 in FIG. 4). Thereafter, differentiator 34 will continuously determine the polarity of the change of the previously saved value with respect to the then-current value of the $V_{Ref}$ signal (see, 38 in FIG. 4). If the polarity is negative, indicating that the current $V_{Ref}$ signal is lower than the previously-saved $V_{Ref}$ signal, differentiator 34 will assert a change direction signal; otherwise, differentiator 34 will negate the change direction signal (see, 40 in FIG. 4).

In response to each negation of t, a direction selector 42 will toggle between an up state and a down state if and only if differentiator 34 is then asserting the change direction signal; otherwise, selector 42 continues to maintain its current state (see, 44 in FIG. 4).

In response to the PowerOK signal, a ramp generator 46 will reset to a predetermined initial value (see, 20 in FIG. 4). Thereafter, in response to each assertion of t, generator 46 will selectively change the value of capacitor 6, thereby changing the resonant frequency $f_R$ of circuit 2' (see, 48 in FIG. 4). Preferably, the initial value for generator 46 is selected such that the initial resonant frequency $f_R$ of circuit 2' will approximate the anticipated carrier frequency $f_C$ of the received signal, thereby assuring convergence with a minimal number of re-tuning cycles. Although the initial value can be established using any of several known non-volatile techniques, including hard wiring or any of a variety of read-only-memory (ROM) structures, I prefer to use a re-writable mechanism, such as a flash or other electrically-programmable ROM structure. Using the latter, it would be a simple matter to construct regulator 16 so as to provide a PowerLoss signal when the level of available power drops to a predetermined minimum, and then, in response to the PowerLoss signal, to copy the current value in generator 46 into the memory. Upon next receiving the PowerOK signal, the generator 46 will resume operation at the stored value, potentially reducing convergence time.

In accordance with my invention, after each change in the resonant frequency $f_R$ of circuit 2', circuit 12 again determines the polarity of change of VRef. If the polarity is found to be positive, the resonant frequency $f_R$ is converging toward the carrier frequency $f_C$, so the direction of change is correct. However, if the polarity is found to be negative, the resonant frequency $f_R$ is diverging from the carrier frequency, and the direction of change must be reversed. During operation, circuit 12 will selectively vary the value of capacitor 6 so that the resonant frequency $f_R$ of tank circuit 2' converges toward the carrier frequency $f_C$ of the received signal. Thus, if the polarity is found to be positive, circuit 12 will continue to vary the value of capacitor 6 in the currently-selected direction, say, for example, "up"; but, if the polarity is found to be negative, circuit 12 will switch the direction in which the value of capacitor 6 is varied, i.e., from "up" to "down", and begin varying the value of capacitor 6 in the newly-selected direction, now "down". In this manner, circuit 12 is able to converge the resonant frequency $f_R$ toward the carrier frequency $f_C$ regardless of whether or not the resonant frequency is initially higher or lower than the carrier frequency.

As can be seen, I have designed circuit 12 such that it is irrelevant which direction is initially selected by selector 42, as circuit 12 will quickly detect divergence and reverse the state of selector 42. However, if desired, a predetermined initial direction can be selected during initialization using conventional means.

It is to be expected that, as difference between the resonant frequency $f_R$ of tank circuit 2' and the carrier frequency $f_C$ of the received signal becomes relatively small, the ability of differentiator 34 to detect polarity changes will be significantly diminished. At such time, circuit 12 will tend to seek, i.e., changing tuning direction on each t. Additional circuitry could be easily added to detect this condition and to, for example, significantly decrease the operating frequency of timer 22 or, if desired, cease operation.

Although I have heretofore described my invention in the context of an analog embodiment, my preferred embodiment would be primarily digital. Thus, for example, in the digital circuit 12' shown in FIG. 5, timer 22 could comprise a clock 50 and an up/down-counter 52 adapted to continuously negate the t signal while down-counting to predetermined minimum value and then to continuously assert the t signal while up-counting to a predetermined maximum value, the counter 52 automatically reversing count direction upon reaching the predetermined minimum/maximum values. $V_{Ref}$ generator 32 could be implemented using a full-wave rectifier 54 and a low-pass filter 56, while differentiator 34 could comprise a comparator 58 with its positive input adapted to receive the current value of $V_{Ref}$ and its negative input adapted to receive the previous value of $V_{Ref}$ captured and saved by a sample-and-hold 60. Finally, selector 42 can be a simple toggle latch 62, while generator 46 could be an n-bit, bidirectional edge-triggered shift register 64. In response to the assertion of the PowerOK signal, shift register 64 will preferably initialize the high-order half of the n-bits to logic__0, and the low-order half to logic__1; in response to the leading-edge of the t signal (i.e., upon each assertion of t), shift register 64 will shift either left or right, depending on the state of toggle latch 62. Thus, to increase frequency, register 64 would perform a right-shift with a left fill of logic__0; whereas to decrease frequency, register 64 would perform a left-shift with a right-fill of logic__1.

It will be seen that, when comparator 58 negates the change direction signal, the resonant frequency of circuit 2" is converging on the carrier frequency of the received signal; whereas, when comparator 58 asserts the change direction signal, the resonant frequency of circuit 2" is diverging from the carrier frequency of the received signal. Thus, for example, if the old value held in sample-and-hold 60 is less than the new value provided by the filter 56, comparator 58 will negate the change direction signal, indicating that register 64 is shifting in the correct direction to achieve convergence; under this condition, toggle 62 will not toggle. On the other hand, if the old value held in sample-and-hold 60 is greater than the new value provided by the filter 56, comparator 58 will assert the change direction signal, indicating that register 64 is not shifting in the correct direction to achieve convergence; under this condition, toggle 62 will toggle.

In the embodiment shown in FIG. 5, I recommend selecting the minimum anticipated settling time of the sample-and-hold 60 as the minimum duration of the negated portion of each t pulse. For the period of t, I recommend selecting the minimum anticipated settling time of the tank circuit 2' to each variation in tank capacitance. In such an arrangement, I would expect the negated portion of each t pulse to be relatively small with respect to the asserted portion. In general, this arrangement should enable circuit 12' to "re-tune" the tank circuit 2' as quickly as the various circuit components are able to detect, and then respond to, the resulting changes in $V_{Ref}$.

Figure 6:
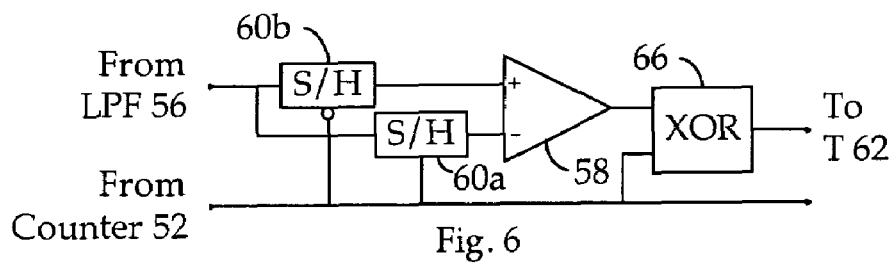
FIG. 6 illustrates in block schematic form, an alternative embodiment of the differentiator of FIG. 1, suitable for substitution into the embodiment shown in FIG. 5.

Shown in FIG. 6 is an alternative embodiment of the differentiator 34 suitable for use in the circuit 12' shown in FIG. 5. In this embodiment, I include a matched pair of sample-and-hold circuits 60a and 60b, each having a sample input coupled to the output of the LPF 56 and a hold output coupled to a respective one of the +/− inputs of the comparator 58. I couple the control input of sample-and-hold 60a to the t signal such that, in the interval between the trailing-edge and the leading-edge of the t signal, the output of sample-and-hold 60a will continuously track the "current" value of $V_{Ref}$, whereas, in the interval between the leading-edge and the trailing-edge of the t signal, the output of sample-and-hold 60a will hold the value of $V_{Ref}$ that existed at the leading-edge of the t signal. In contrast, I couple the control input of sample-and-hold 60b to the inverse of t signal so that, in the interval between the leading-edge and the trailing-edge of the t signal, the output of sample-and-hold 60b will continuously track the "current" value of $V_{Ref}$, whereas, in the interval between the trailing-edge and the leading-edge of the t signal, the output of sample-and-hold 60b will hold the value of $V_{Ref}$ that existed at the trailing-edge of the t signal. Thus, during each half-cycle of t, comparator 58 will be comparing the "new" value of $V_{Ref}$ to the "old" value saved in a respective one of the sample-and-holds 60a and 60b. To account for the fixed +/− polarity of the inputs of comparator 58, I have coupled the output of comparator 58 to a first input of an exclusive-or circuit, XOR 66, and to the other input of XOR 66 I have coupled t. In operation, the output of XOR 66 will be asserted only if the new value of $V_{Ref}$ is determined by comparator 58 to be less than the old value of $V_{Ref}$. Since this embodiment (and its logical/functional equivalents) is capable of performing a new comparison on each edge of t, both toggle 62 and register 64 must be modified so as also to be responsive to both edges of t. In this embodiment, I prefer the duty-cycle of t to be approximately fifty percent (50%).

Rather than use the XOR 66, it would be possible to provide a multiplexor (not shown), responsive to the t signal, to alternately couple then cross-couple the hold outputs of the sample-and-holds 60a and 60b such that the old value of $V_{Ref}$ is always coupled to the negative input of comparator 58 and the new value of $V_{Ref}$ is always coupled to the positive input of comparator 58. In such an arrangement, the polarity of the output of comparator 58 will always be consistent without regard to which sample-and-hold is holding the old value of $V_{Ref}$; that is, the output of comparator 58 will always be positive if the new value of $V_{Ref}$ is greater than the old value, and negative if the new value is less than the old value. Alternatively, it would also be possible to provide a multiplexor (not shown), responsive to the t signal, to alternately couple the output of comparator 58 and the inverse thereof to the input of toggle 62. In both of these alternate embodiments (and their logical/functional equivalents), I would again recommend the duty-cycle of t to be approximately fifty percent (50%).

Figure 7:
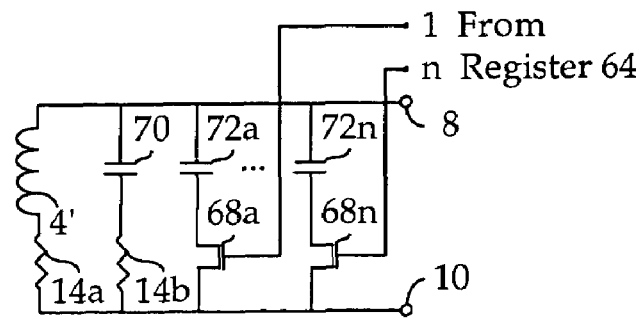
FIG. 7 illustrates a preferred embodiment for the variable capacitive and resistive elements specially adapted for use with the embodiment shown in FIG. 5.

In accordance with a preferred embodiment of my invention as shown in FIG. 7, each of the n bits in register 64 controls, at a minimum, a respective one of n solid-state switches 68a through 68n. Thus, for example, in my tank circuit 2", I start with a fixed capacitor 70 selected to provide what I expect to be the minimum required capacitance (i.e., maximum resonant frequency) for anticipated operating conditions. I then provide n smaller capacitors 72a through 72n, the sum of whose capacitances, when added to the capacitance of capacitor 70, represent what I expect to be the maximum required capacitance (i.e., minimum resonant frequency) for anticipated operating conditions. During system operation, each of the n switches 68a through 68n is opened/closed by an output from a respective one of the n bits in register 64, thereby selectively adding the respective capacitor 72a-72n to the circuit 2".

As can be seen from Eq. 1 and Eq. 2, adding capacitance to circuit 2" decreases the resonant frequency, while subtracting capacitance increases the resonant frequency. Remember that I have initialized register 64 such that a predetermined number of all of the switched capacitors 72a-72n are initially switched into circuit 2". If capacitors 70 and 72a-72n has been properly selected, the initial resonant frequency of circuit 2" will be approximately equal to the expected carrier frequency. Thus, convergence can be efficiently achieved by gradually adding/subtracting capacitors 72a through 72n until, at nearest convergence, toggle 62 will begin dithering. As noted above, although not essential, additional circuitry could be added to detect this condition and significantly drop the rate of sampling, for example, by dynamically changing the minimum/maximum count values of counter 52. It would also be possible to terminate tuning altogether, but at the risk of losing sync due to unexpected changes in the system operating characteristics, such as might result from physical movement of the tag to another location within the perimeter of the system.

Thus it is apparent that I have provided an efficient method and apparatus for dynamically varying the impedance of a tank circuit, and, in particular, wherein the impedance of the circuit can be efficiently varied so as to dynamically shift the $f_R$ of the circuit to better match the $f_C$ of a received signal and thereby improve the response of the circuit. Those skilled in the art will recognize that modifications and variations can be made without departing from the spirit of my invention. For example, although in the embodiment I have shown in FIG. 5 I chose to implement the non-linear transfer function performed by my reference voltage generator 32 using a combination of full-wave rectifier 54 and low-pass filter 56, there exist many effective substitutions, including, for example, a multiplier, such as the well-known Gilbert Multiplier Circuit (shown and described in Section 2.5 of "An Analog Cell Library Useful for Artificial Neural Networks", IEEE Proceedings—1990 Southeastcon, a copy of which is submitted herewith and incorporated herein in its entirety by reference). Similarly, I recognize that additional signal conditioning circuits, gain stages, and the like, may be added, if desired, in the designs of practical, robust, commercial implementations. Further, although I prefer to measure the response of the tank circuit 2' using a voltage reference generator 32, it would be possible to develop a suitable reference that is proportional to the phase difference between the resonant frequency $f_R$ and the carrier frequency $f_C$. Therefore, I intend that my invention encompass all such variations and modifications as fall within the scope of the appended claims.

What I claim is:

1. A tuning circuit for dynamically varying the impedance of a tank circuit comprising an inductor and a capacitor, the capacitance of which can be varied in a selected one of first and second directions, the tuning circuit comprising:
   a reference voltage generator, coupled to the tank circuit, to produce a reference voltage proportional to the response of the tank circuit to a received signal, wherein the voltage generator comprises:
   a rectifier, coupled to the tank circuit; and
   a low pass filter, coupled to the rectifier;

a differentiator, coupled to the generator, to determine a polarity of the change in the reference voltage between a first point in time and a second point in time, wherein the differentiator comprises:
  a sample-and-hold, coupled to the voltage generator, to sample the reference voltage at said first point in time; and
  a comparator, having a first input coupled to the sample-and-hold, and a second input coupled to the voltage generator;
a direction selector, coupled to the differentiator, to select one of said first and second directions in response to said polarity, wherein the direction selector comprises:
  a toggle, coupled to the differentiator, to toggle between said first and second directions in response to a negative polarity; and
a ramp generator, coupled to the selector and to the capacitor, to selectively vary the capacitance of said capacitor in said selected direction, wherein the ramp generator comprises:
  a shift register, coupled to the direction selector.

2. A method for dynamically varying the impedance of a tank circuit comprising an inductor and a capacitor, the capacitance of which can be varied in a selected one of first and second directions, the method comprising the steps of:
  (1) selecting, at random, one of said first and second directions;
  (2) capturing a current response of the circuit to a received signal;
  (3) varying the capacitor in said selected direction;
  (4) comparing the captured response to the current response;
  (5) if the comparison made in step 4 indicates that the current response is weaker than the captured response, selecting the other of said directions; and
  (6) returning to step 2.

3. The method of claim 2 wherein step 6 is further characterized as:
  (6) if the comparison made in step 4 indicates that the difference between the current response and the captured response is greater than a predetermined minimum, returning to step 2.

4. The method of claim 2 wherein step 6 is further characterized as:
  (6) if the comparison made in step 4 indicates that the difference between the current response and the captured response is greater than a predetermined minimum, selectively returning to step 2.

5. A tuning circuit for dynamically varying the impedance of a tank circuit comprising an inductor and a capacitor, the capacitance of which can be varied in a selected one of first and second directions, the tuning circuit comprising:
  a reference voltage generator, coupled to the tank circuit, to produce a reference voltage proportional to the response of the tank circuit to a received signal;
  a differentiator, coupled to the generator, to determine a polarity of the change in the reference voltage between a first point in time and a second point in time;
  a direction selector, coupled to the differentiator, adapted to select, at random, one of said first and second directions in response to said polarity prior to said second point in time; and
  a ramp generator, coupled to the selector and to the capacitor, to selectively vary the capacitance of said capacitor in said selected direction.

6. The circuit of claim 5 wherein the direction selector is adapted to select the other of said first and second directions in response to a negative polarity.

7. The circuit of claim 5 wherein the voltage generator comprises:
  a rectifier, coupled to the tank circuit; and
  a low pass filter, coupled to the rectifier.

8. The circuit of claim 5 wherein the differentiator comprises:
  a sample-and-hold, coupled to the voltage generator, to sample the reference voltage at said first point in time; and
  a comparator, having a first input coupled to the sample-and-hold, and a second input coupled to the voltage generator.

9. The circuit of claim 5 wherein the direction selector comprises:
  a toggle, coupled to the differentiator, to toggle between said first and second directions in response to a negative polarity.

10. The circuit of claim 5 wherein the ramp generator comprises:
  a shift register, coupled to the direction selector.

11. The circuit of claim 5 wherein the voltage generator comprises:
  a non-linear transfer circuit, coupled to the tank circuit.

12. A method for dynamically varying the impedance of a tank circuit comprising an inductor and a capacitor, the capacitance of which can be varied in a selected one of first and second directions, the method comprising the steps of:
  (1) selecting, at random, one of said first and second directions;
  (2) capturing a current response of the circuit to a signal received via said indicator;
  (3) varying the capacitor in said selected direction;
  (4) comparing the captured response to the current response;
  (5) if the comparison made in step 4 indicates that the current response is weaker than the captured response, selecting the other of said directions; and
  (6) returning to step 2.

13. The method of claim 12 wherein step 6 is further characterized as:
  (6) if the comparison made in step 4 indicates that the difference between the current response and the captured response is greater than a predetermined minimum, returning to step 2.

14. The method of claim 12 wherein step 6 is further characterized as: (6) if the comparison made in step 4 indicates that the difference between the current response and the captured response is greater than a predetermined minimum, selectively returning to step 2.

15. A tuning circuit for dynamically varying the impedance of a tank circuit comprising an inductor and a capacitor, the capacitance of which can be varied in a selected one of first and second directions, the tuning circuit comprising:
  a reference voltage generator, coupled to the tank circuit, to produce a reference voltage proportional to the response of the tank circuit to a signal received via said inductor;
  a differentiator, coupled to the generator, to determine a polarity of the change in the reference voltage between a first point in time and a second point in time;
  a direction selector, coupled to the differentiator, adapted to select, at random, one of said first and second directions in response to said polarity prior to said second point in time; and a ramp generator, coupled to the selector and to the capacitor, to selectively vary the capacitance of said capacitor in said selected direction.

16. The circuit of claim 15 wherein the direction selector is adapted to select the other of said first and second directions in response to a negative polarity.

17. The circuit of claim 15 wherein the voltage generator comprises:
a rectifier, coupled to the tank circuit; and
a low pass filter, coupled to the rectifier.

18. The circuit of claim 15 wherein the differentiator comprises:
a sample-and-hold, coupled to the voltage generator, to sample the reference voltage at said first point in time; and
a comparator, having a first input coupled to the sample-and-hold, and a second input coupled to the voltage generator.

19. The circuit of claim 15 wherein the direction selector comprises:
a toggle, coupled to the differentiator, to toggle between said first and second directions in response to a negative polarity.

20. The circuit of claim 15 wherein the ramp generator comprises:
a shift register, coupled to the direction selector.

21. The circuit of claim 15 wherein the voltage generator comprises:
a non-linear transfer circuit, coupled to the tank circuit.

22. A method for dynamically varying the impedance of a tank circuit comprising an inductor and a capacitor coupled in parallel with said inductor, the capacitance of which can be varied in a selected one of first and second directions, the method comprising the steps of:
(1) selecting, at random, one of said first and second directions;
(2) capturing a current response of the circuit to a received signal;
(3) varying the capacitor in said selected direction;
(4) comparing the captured response to the current response;
(5) if the comparison made in step 4 indicates that the current response is weaker than the captured response, selecting the other of said directions; and
(6) returning to step 2.

23. The method of claim 22 wherein step 6 is further characterized as:
(6) if the comparison made in step 4 indicates that the difference between the current response and the captured response is greater than a predetermined minimum, returning to step 2.

24. The method of claim 22 wherein step 6 is further characterized as:
(6) if the comparison made in step 4 indicates that the difference between the current response and the captured response is greater than a predetermined minimum, selectively returning to step 2.

25. A tuning circuit for dynamically varying the impedance of a tank circuit comprising an inductor and a capacitor coupled in parallel with said inductor, the capacitance of which can be varied in a selected one of first and second directions, the tuning circuit comprising:
a reference voltage generator, coupled to the tank circuit, to produce a reference voltage proportional to the response of the tank circuit to a received signal;
a differentiator, coupled to the generator, to determine a polarity of the change in the reference voltage between a first point in time and a second point in time;
a direction selector, coupled to the differentiator, adapted to select, at random, one of said first and second directions in response to said polarity prior to said second point in and
a ramp generator, coupled to the selector and to the capacitor, to selectively vary the capacitance of said capacitor in said selected direction.

26. The circuit of claim 25 wherein the direction selector is adapted to select the other of said first and second directions in response to a negative polarity.

27. The circuit of claim 25 wherein the voltage generator comprises:
a rectifier, coupled to the tank circuit; and
a low pass filter, coupled to the rectifier.

28. The circuit of claim 25 wherein the differentiator comprises:
a sample-and-hold, coupled to the voltage generator, to sample the reference voltage at said first point in time; and
a comparator, having a first input coupled to the sample-and-hold, and a second input coupled to the voltage generator.

29. The circuit of claim 25 wherein the direction selector comprises:
a toggle, coupled to the differentiator, to toggle between said first and second directions in response to a negative polarity.

30. The circuit of claim 25 wherein the ramp generator comprises:
a shift register, coupled to the direction selector.

31. The circuit of claim 25 wherein the voltage generator comprises:
a non-linear transfer circuit, coupled to the tank circuit.

* * * * *